US006091297A

United States Patent [19]
Bar-David et al.

[11] Patent Number: 6,091,297
[45] Date of Patent: Jul. 18, 2000

[54] METHODS AND APPARATUS FOR ADAPTIVE ADJUSTMENTS OF FEED-FORWARD LINEARIZED AMPLIFIERS

[75] Inventors: Israel Bar-David; Avner Elia, both of Haifa, Israel

[73] Assignee: Paragon Communications Ltd., Haifa, Israel

[21] Appl. No.: 09/136,040

[22] Filed: Aug. 20, 1998

[30] Foreign Application Priority Data

Jun. 21, 1998 [IL] Israel ........................................ 125022

[51] Int. Cl.[7] ........................................................ H03F 1/26
[52] U.S. Cl. ............................................. 330/149; 330/151
[58] Field of Search ..................................... 330/149, 151; 375/296, 297; 455/63

[56] References Cited

U.S. PATENT DOCUMENTS

| | | | |
|---|---|---|---|
| 5,770,971 | 6/1998 | McNicol | 330/151 X |
| 5,789,976 | 8/1998 | Channouchi et al. | 330/151 X |
| 5,929,704 | 7/1999 | Proctor et al. | 330/149 |

*Primary Examiner*—Steven J. Mottola
*Attorney, Agent, or Firm*—Edward Langer, Pat. Atty

[57] ABSTRACT

The invention provides methods and apparatus for adaptive adjustment of the phase and amplitude controllers that are needed in Feed Forward Linearized Amplifiers (FFLA) to balance, first, the desired signal component and then the distortion component for the eventual full suppression of the latter. The particular advantage of the methods of the invention is that the adaptive adjustment is achieved without the need for additional RF reference or pilot signals and without RF correlators as proposed in prior art; rather, it is based solely on envelope-detected samples of the signal at two test points and on perturbations of the quiescent operating points of the amplifiers and/or other components, such as vector modulators, by appropriately selected voltage patterns. All these operations are at base band frequencies which makes the apparatus for the adaptive control implementable in simple digital circuitry.

20 Claims, 7 Drawing Sheets

METHODS AND APPARATUS FOR ADAPTIVE ADJUSTMENTS OF FEED-FORWARD LINEARIZED AMPLIFIERS

FIELD OF THE INVENTION

The present invention relates generally to linear amplifiers, and more particularly to adaptive feed-forward systems for reducing distortion products of amplifiers, to provide linearization.

BACKGROUND OF THE INVENTION

There are known feed forward systems used to reduce distortion in amplifiers, by a two-step method involving adjustments of the vector modulator in the nulling loop, and adjustment of the vector modulator in the error loop, some using a pilot reference signal. These methods use a correlation technique which seeks to maximize the signal correlation before elimination of the desired signal, so as to provide minimum correlation after cancellation.

Examples of the above methods are described in U.S. Pat. No. 4,389,618 to Bauman, and U.S. Pat. No. 5,576,659 to Kenington et al. The disadvantage of the first is that for adaptation of the system parameters, complex correlators that operate at RF are required for the synchronous detection, while the disadvantage of the latter is that is requires an additional RF Signal Generator for a reference signal, on which the adaptation is based. The result is that prior art systems require cumbersome and expensive apparatus.

In U.S. Pat. No. 5,548,838 to Talwar, there is disclosed an interference cancellation system employing a polar vector modulator, which operates to adjust the amplitude and phase of a reference signal, which when summed with a received signal, acts to eliminate an interfering signal component of the received signal.

Another reference containing descriptions useful in linearization system design is entitled, "Optimal feed forward linearization system design", Eid E. Eid et al., Microwave journal, Nov. 1995.

While the feedforward method is the most effective for the linearization of power amplifiers, there remains the problem of developing an adaptive adjustment of phase and amplitude controllers needed to suppress the distortion components, and in the prior art, this is usually complicated by the need for additional RF reference or pilot signals.

Therefore, it would be desirable to provide a simple method of adaptive adjustment for use in a feedforward linearization system.

SUMMARY OF THE INVENTION

Accordingly, it is a principal object of the present invention to overcome the disadvantages associated with prior art linearization methods, and provide a simple method for adaptive distortion cancellation, thereby simplifying the needed apparatus.

The invention provides methods and apparatus for adaptive adjustment of the phase and amplitude controllers that are needed in Feed Forward Linearized Amplifiers (FFLA) to balance, first, the desired signal component in the nulling loop and then the distortion component in the error loop for the eventual full suppression of the latter.

In accordance with a preferred embodiment of the present invention, there is provided a method for adaptive adjustment of a feed-forward linearized amplifier having an input signal path which divides into two parallel signal paths, at least one signal path having a vector modulation means responsive to control signals for adjusting the amplitude and phase of an input signal propagating in both signal paths, said method comprising the steps of:

generating baseband perturbation patterns for addition to at least one of said signal paths among said input signal path and said two parallel signal paths;

subtracting the outputs of said parallel signal paths one from another to produce a loop output signal;

detecting an amplitude variation due to said perturbation patterns within said loop output signal, and adjusting said vector modulation means via the vector modulation control signals in accordance with said detected amplitude variation to achieve equalization between said parallel signal paths so as to cancel said input signal within said loop output signal.

In the preferred method, equalization is obtained by superimposing controlled perturbing voltage patterns, at base band frequencies, on the voltages supplied to the amplifier and/or on the voltages that control the I and Q components of the vector modulators in the balancing branches of the feed forward configurations. These perturbations appear as an amplitude modulation on the combined broadband amplified signal, and are easily detected by an envelope detector such as a diode power sensor and subsequently correlated with their sources yielding control voltages that feed appropriate algorithms for the adaptive setting of the parameters of the vector modulators.

The particular advantage of the methods of this invention is that the adaptive adjustment is achieved without the need for additional RF reference or pilot signals and without RF correlators as proposed in prior art; rather, it is based solely on envelope-detected samples of the signal at two test points and on perturbations of the quiescent operating points of the amplifiers and/or other components, such as vector modulators by appropriately selected voltage patterns.

A main advantage of the inventive method is that the correlations are performed at base-band and therefore are implementable in simple digital circuitry such as a digital ASIC chip, or a DSP chip, along with the functions of the adaptation.

Orthogonal perturbing patterns can be superimposed on the amplitude and/or on the I and Q controllers, for independent adjustment of the individual settings.

Other features and advantages of the invention will become apparent from the following drawings and description.

BRIEF DESCRIPTION OF THE DRAWINGS

For a better understanding of the invention with regard to the embodiments thereof reference is made to the accompanying drawings, in which like numerals designate corresponding elements or sections througout, and in which.

DETAILED DESCRIPTION OF THE PREFERRED EMBODIMENTS

Figure 1A:
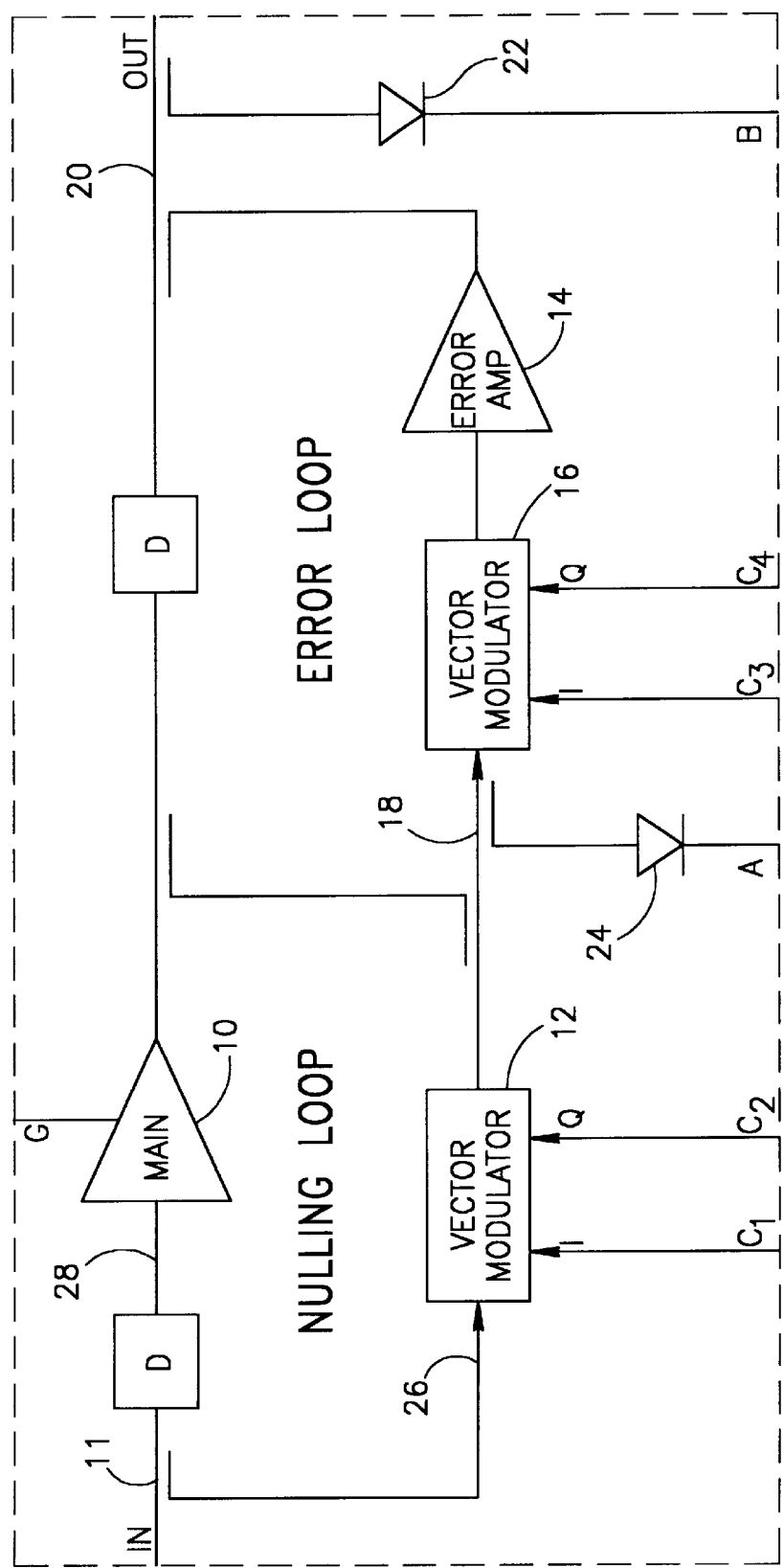
FIGS. 1a–b are schematic block diagrams of prior art configurations of feedforward linearized amplifiers.
Figure 1B:
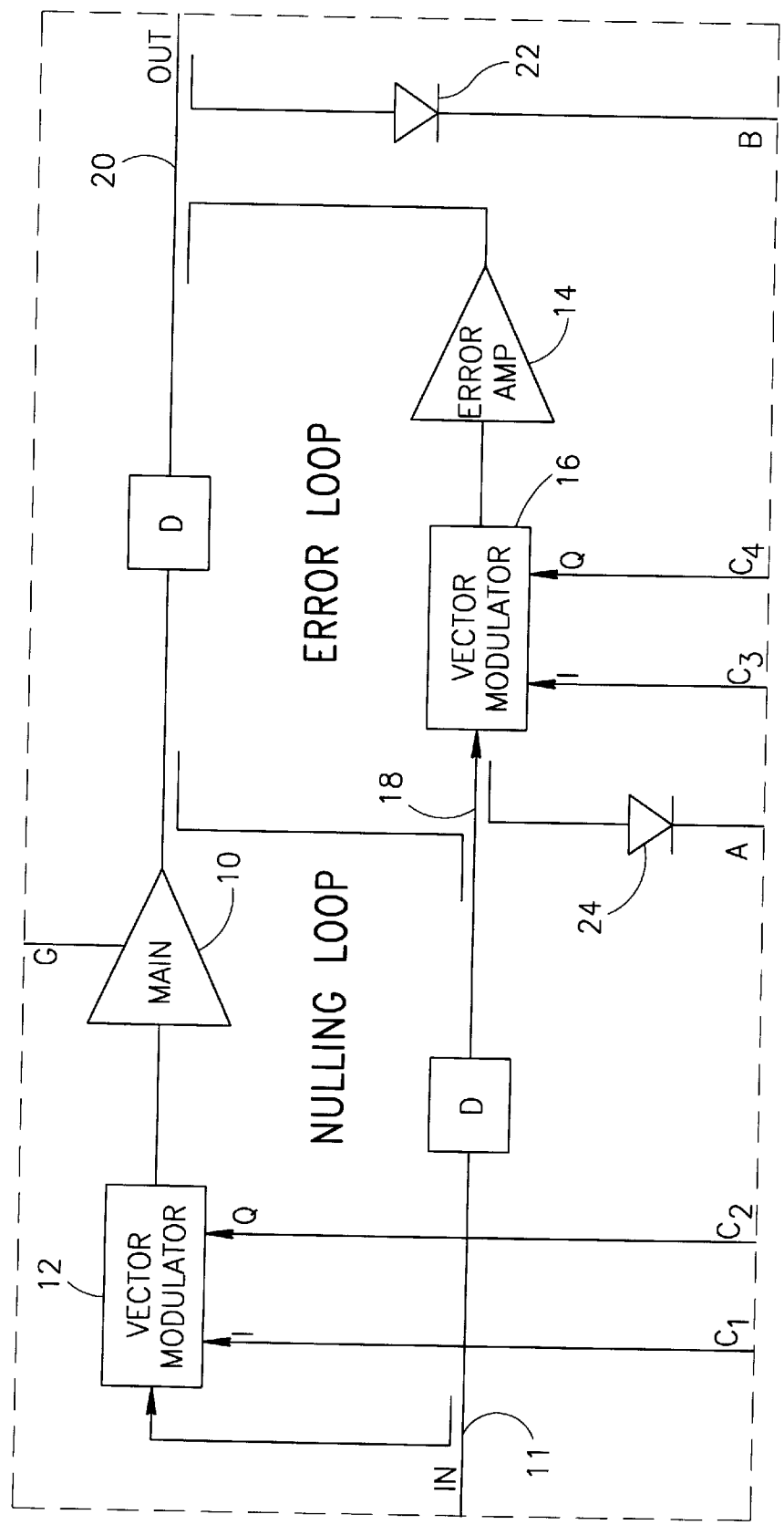

Referring now to FIGS. 1a, 1b, there are shown two well-known alternative configurations of feedforward linearized amplifiers (FFLA's). In FIG. 1, an amplifier 10 (main) is arranged in a nulling loop with a compensating delay element (D) and a vector modulator 12, and another amplifier 14 is arranged in an error loop, with a compensating delay element (D) and a vector modulator 16. The terminals C1, C2, C3 and C4 accept control voltages for the quadrature I and Q settings, for the vector modulators 12, 16. The vector modulators 12, 16 serve to adjust the transfer characteristics of the branches in the nulling loops to achieve the required cancellation. The terminal G serves as a gain control and terminals A and B are amplitude-detected versions of the RF signal at the two loop outputs 18, 20.

The alternative version of FIG. 1a is shown in FIG. 1b, and the two versions are different only in the nulling loop that nominally eliminates the desired signal and leaves the distortion component as the only input to the error loop. The advantage of FIG. 1b over FIG. 1a is that the overall gain is fixed and all the imperfections of the vector modulators are cancelled along with the distortions of the main amplifier 10.

In accordance with the principles of the present invention, the adaptive control of the I-Q setting of each of the vector modulators 12, 16 can be achieved in FFLA's without the need for additional RF reference or pilot signals and without RF correlators as proposed in the prior art. Two methods of nulling specific RF signal components are described herein, based on the amplitude-detected overall RF signal at A and B.

These methods depend on perturbing the quiescent operating points of the components such as to produce amplitude modulations of the overall RF signal, detectable by envelope detectors such as diodes 22, 24. The perturbations are properly selected base-band voltage patterns, preferably orthogonal, such that they can be sorted out by post-detection correlators. These two methods are described below in connection with FIGS. 2, 3a and 3b. These are generic methods to equalize in amplitude and phase two replicas of a band-pass signal that passed via two different paths 26, 28.

Figure 2:
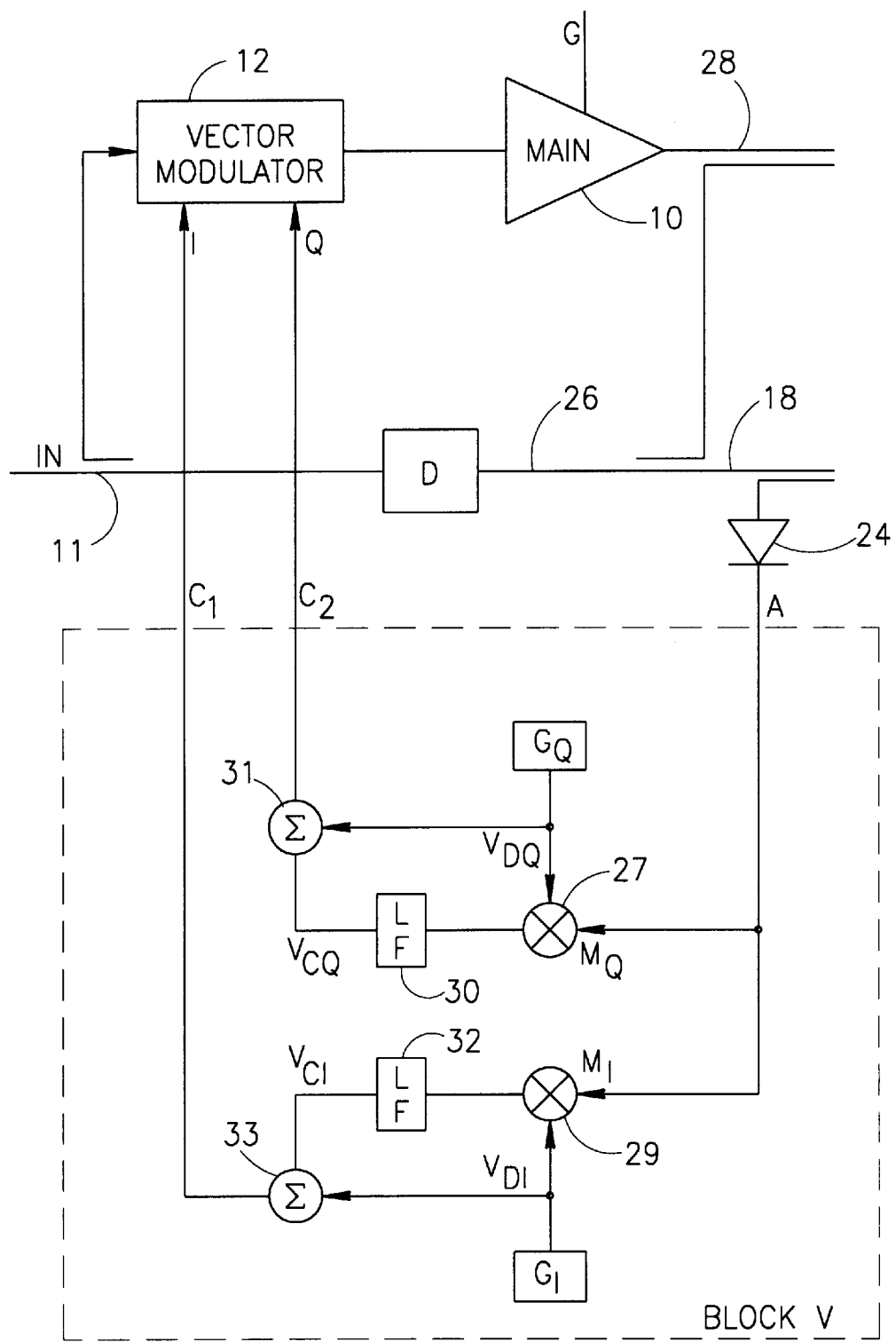
FIG. 2 is a schematic block diagram of an amplifier showing a coherent adaptive cancellation method applied in accordance with the principles of the present invention.

In FIG. 2, the coherent method of adaptive cancellation is shown by block V. Two generators $G_I$ and $G_Q$ provide as output the perturbation patterns $V_{DI}(t)$ and $V_{DQ}(t)$, which are added in respective adders 33, 31 onto the control voltages $V_{CI}$ and $V_{CQ}$ obtained from the respective loop filters 32, 30. These cause amplitude modulation of the signals entering the main amplifier 10 output module. The detected envelope at terminal A has two components $V'_{DI}(t)$ and $V'_{DQ}(t)$, and these components are proportional to $V_{DI}(t)$ and $V_{DQ}(t)$ respectively, which can be isolated by the correlators MI, MQ and the low-pass filters 30, 32, due to the original orthogonality of $V_{DI}(t)$ and $V_{DQ}(t)$. The outputs of the correlators MI, MQ (29, 27) are the smoothed control voltages $V_{CI}$ and $V_{CQ}$, closing the basically linear loop.

As will be appreciated by those skilled in the art, all of the functions: generating $V_{DI}(t)$ and $V_{DQ}(t)$, correlating and loop filtering can be performed by simple digital circuitry with the intervention of A/D and D/A conversions at the A, C1 and C2 terminals, respectively. The advantage of the coherent method is that the speed of convergence depends only the loop bandwidths.

Figure 3A:
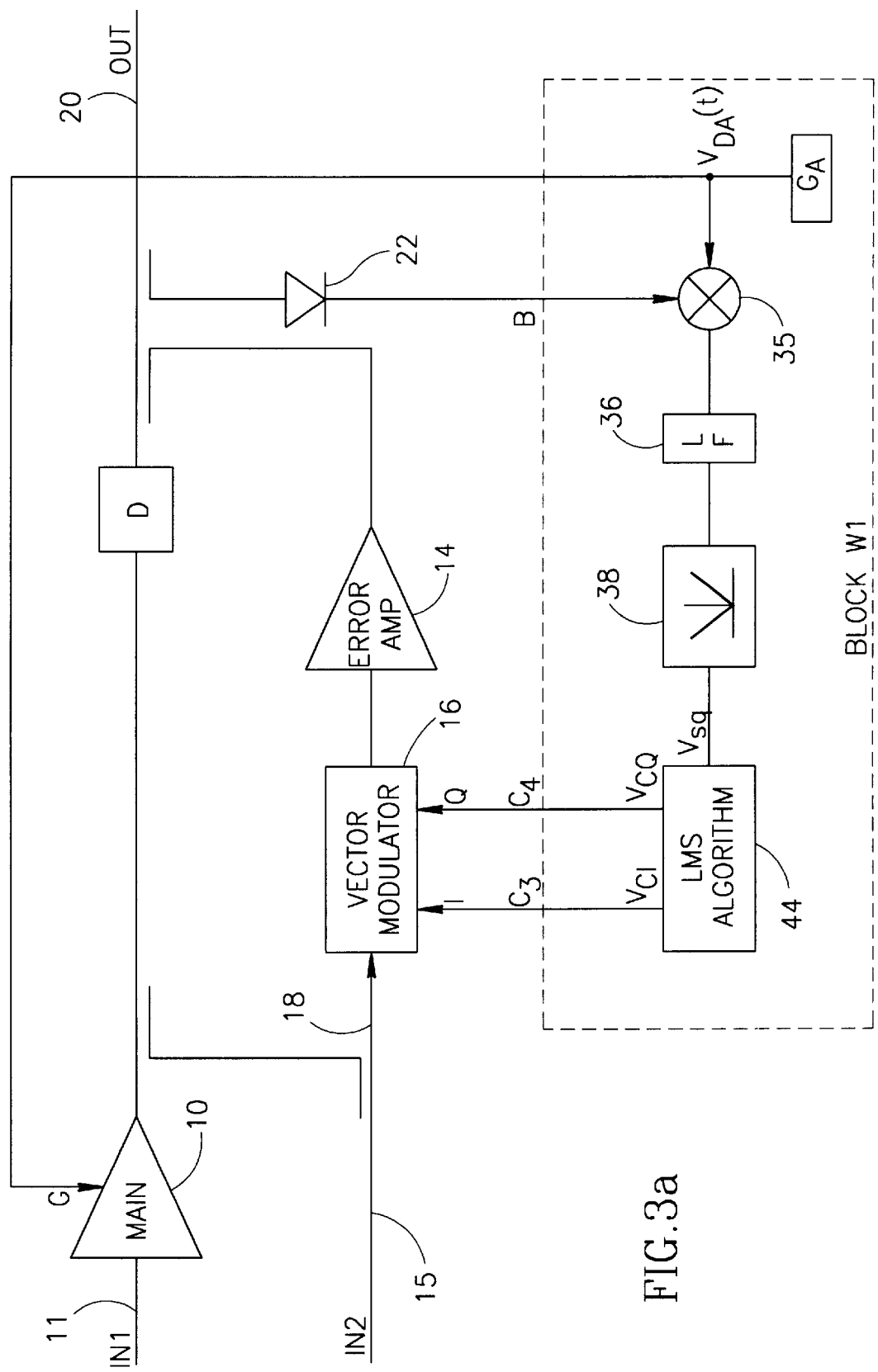
FIGS. 3a–b are schematic block diagrams of an amplifier showing a non-coherent adaptive cancellation method applied in accordance with the principles of the invention.
Figure 3B:
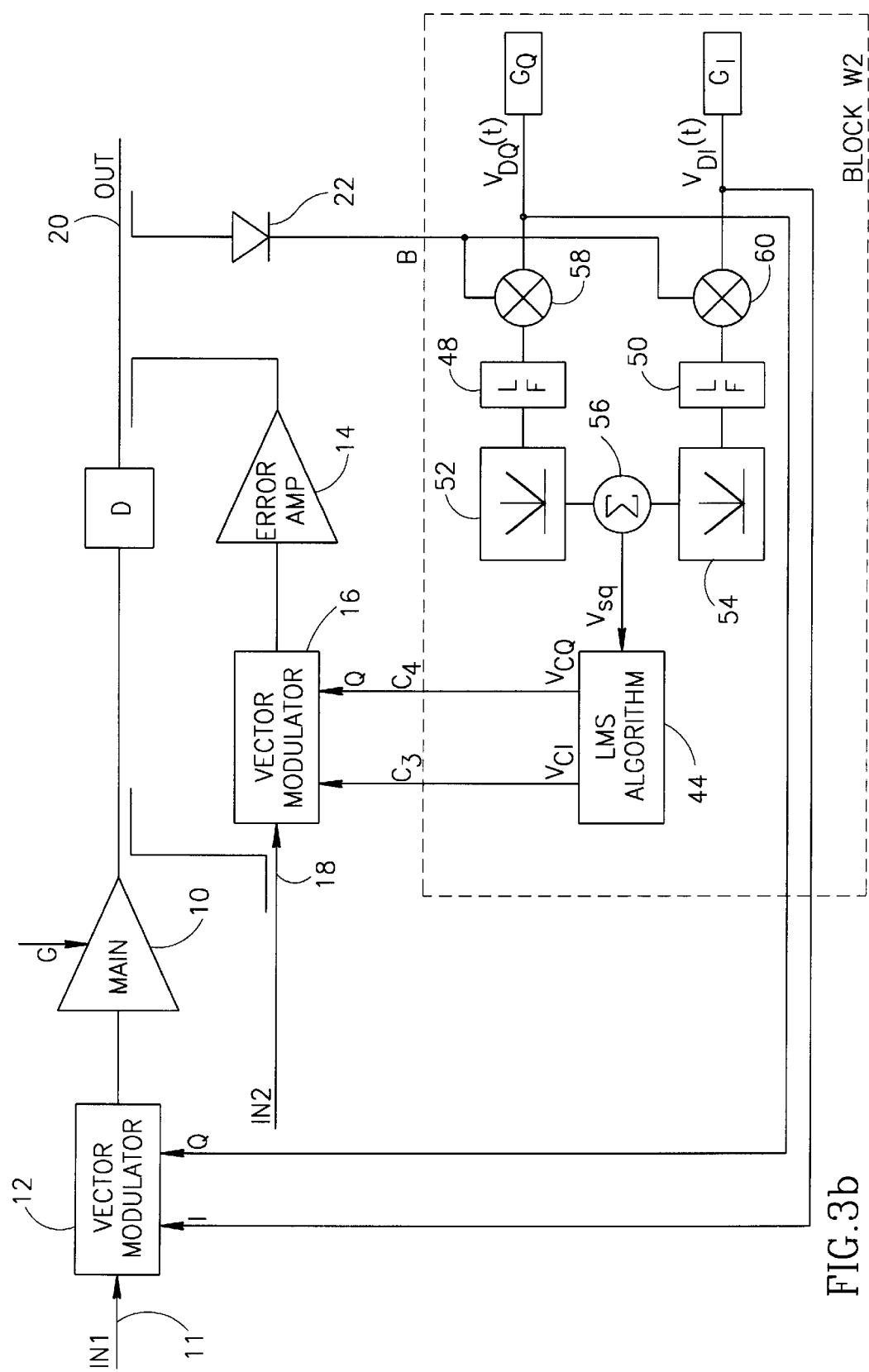

In FIGS. 3a and 3b, the non-coherent method of adaptive cancellation is shown by blocks W1 and W2. This method is useful in particular in those situations where there is a requirement to apply the perturbation in a location other than at the vector modulator that has the controlled I, Q settings. Thus, in FIG. 3a the only perturbation $V_{DA}(t)$ is on the gain of an out-of-loop amplifier 34 generated by generator $G_A$.

The detected amplitude modulation signal at B is correlated in correlator 35 with the perturbation signal $V_{DA}(t)$, filtered by loop filter 36 and fed to a non-linear means 38 for performing a mathematical operation, such as squaring the value or determining its absolute value. Thus the output of means 38, $V_{SQ}$ is a quantity indicative of the residual perturbation signals in the envelope at the output 20. When the vector modulator 16 is perfectly adjusted in the I and Q settings, this quantity will be nulled and so will the entire signal output at 20 due to input IN1 11. The only residual output at 20 will be due to the signal at input IN2. If there is no signal at input IN2, the output signal at 20 will be zero, upon nulling, except for additional distortions occurring in the loop components. To obtain the perfect adjustment of $V_{CI}$ and $V_{CQ}$, an LMS algorithm 44 is operated on $V_{SQ}$. Convergence to the equilibrium point at the minimum of $V_{SQ}$ is ensured, because in any direction that $V_{CI}$ and $V_{CQ}$ will change, $V_{SQ}$ will only increase.

Alternatively, instead of the LMS algorithm, a pair of orthogonal perturbations can be applied to the in-loop vector modulator and correlation can be performed between $V_{SQ}$ and the perturbations, until convergence is achieved.

Referring to FIG. 3b (block W2), vector perturbation is performed on an out-of-loop vector modulator 12. To achieve the same results, the amplitude modulation signal at B is correlated in respective correlators 60, 58 with both orthogonal perturbations $V_{DI}(t)$ and $V_{DQ}(t)$ and the sum in adder 56 of the LF-filtered (48, 50) and squared versions (52, 54) is used as $V_{SQ}$ by the LMS algorithm 44.

Figure 4A:
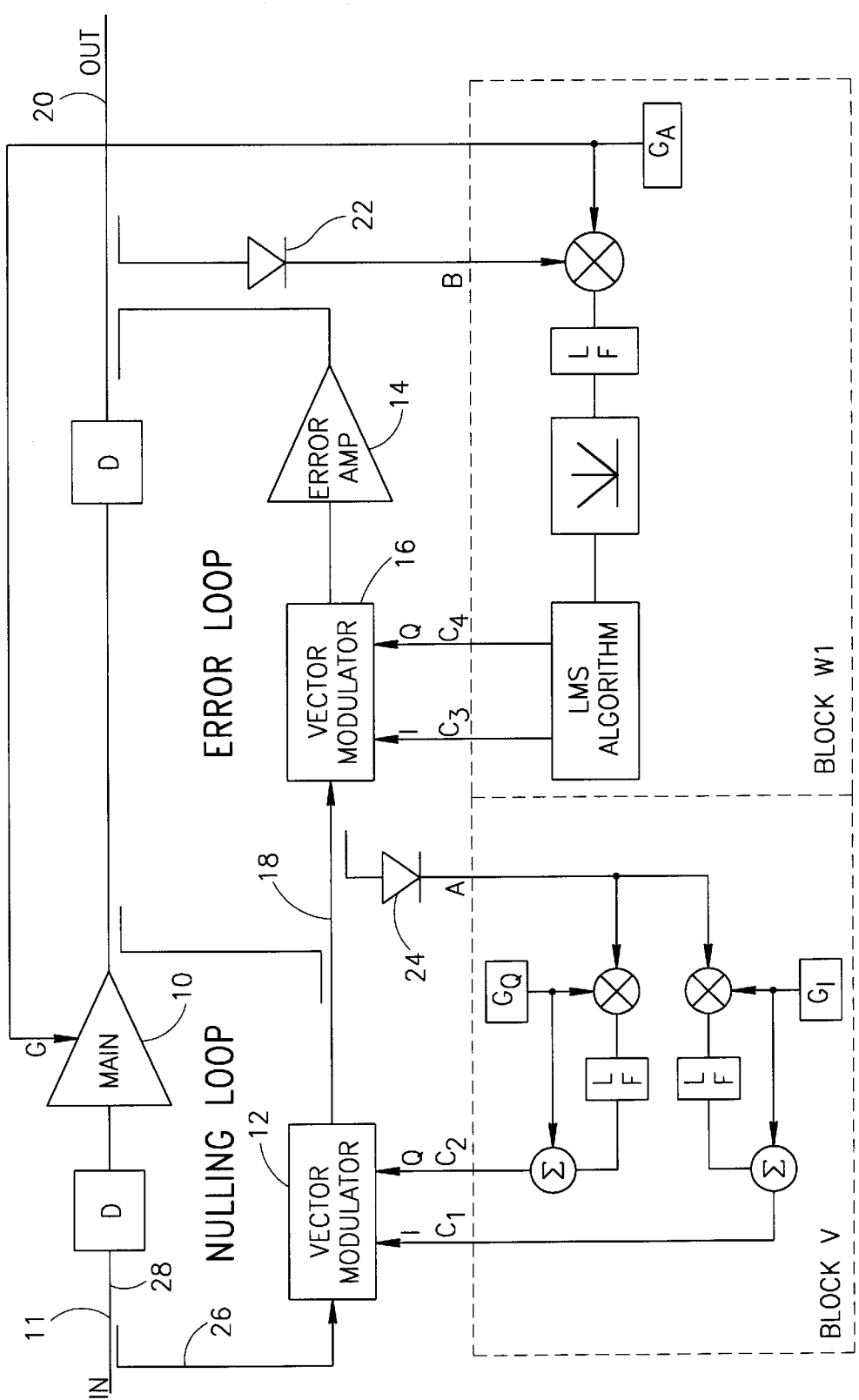
FIGS. 4a–b are schematic block diagrams of an amplifier showing the perturbation method applied to nulling and error loops, to achieve adaptive control of the I,Q settings.
Figure 4B:
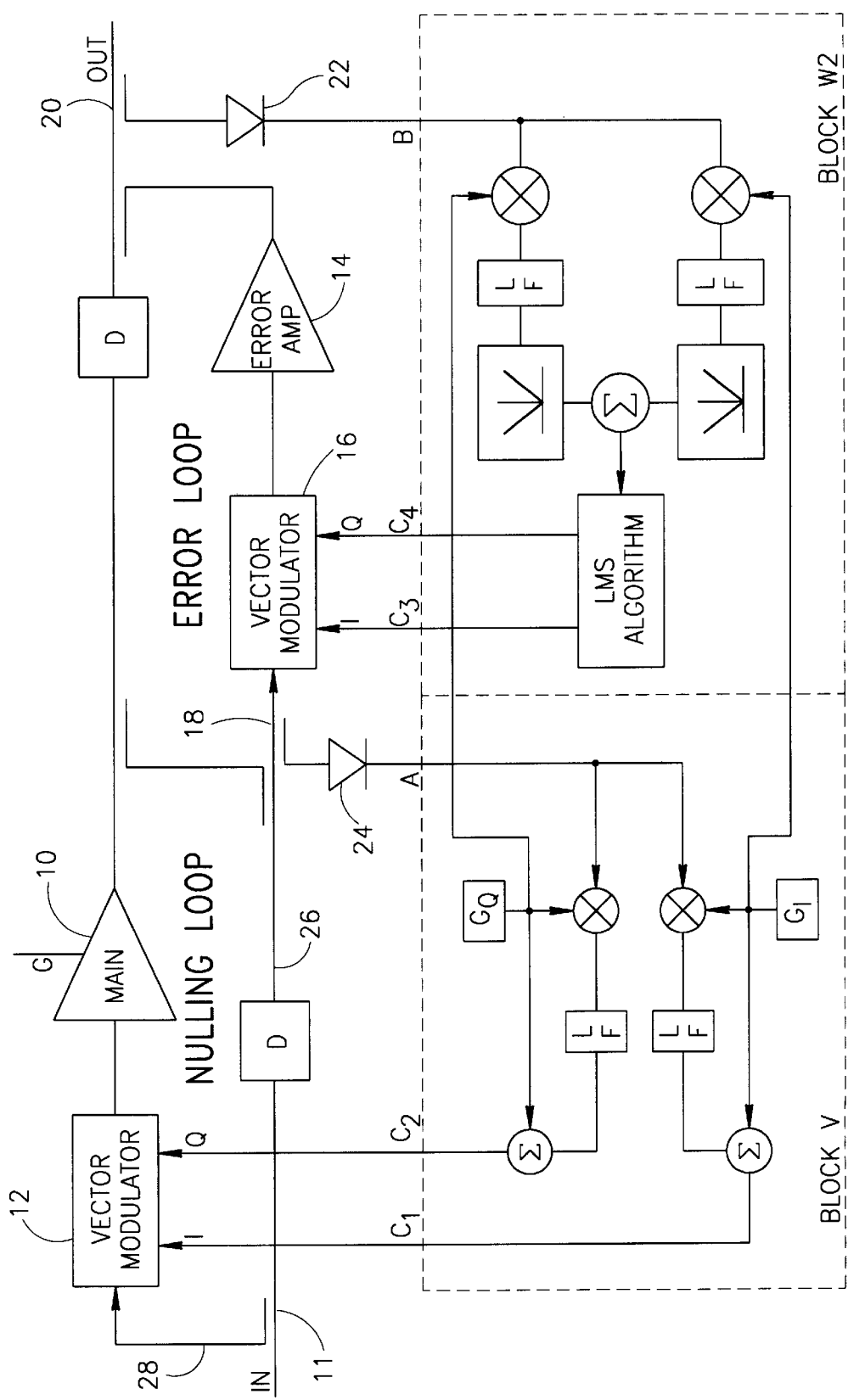

In FIGS. 4a–b, there is shown the application of the coherent and of the non-coherent adaptive cancellation methods to achieve adaptive operation of FFLA's for both configurations introduced in FIGS. 1a and 1b, respectively.

In FIG. 4a, the nulling loop is coherently adapted whereas the error loop non-coherently, with additional out-of-loop amplitude perturbation performed by voltage control of the main amplifier 10. In FIG. 4b, the nulling loop is coherently adapted and the error loop non-coherently with out-of-loop vector perturbation performed by the vector modulator 12. It should be noted that blocks V and W2 (see FIGS. 2, 3b) share the perturbation generators $G_I$ and $G_Q$. This is an additional advantage of the FFLA configuration of FIG. 1b.

In both configurations, at point 18, the replica of the input signal is nominally cancelled and only the amplifier distortion and the amplitude modulation sidebands are present. Of course, at the output port 20 the distortion and the amplitude modulation sidebands are nominally cancelled. The vector-modulation sidebands do appear though at the output port 20 of FIG. 4a. These sidebands are essentially confined to the input signal spectrum, due to the amplitude modulation. Even if the bandwidth of the coherent loop is narrow, the amplitude modulation can be kept low so that the sidelobes will be negligible.

In FIG. 4b, however, the perturbations are introduced in the upper branch of the nulling loop only so that the sidelobes due to the modulation are nulled by the error loop together with the amplifier distortions. This is an additional advantage of the configuration of FIG. 1b. However, its disadvantage is the need for more amplification dictated by the particular configuration.

Having described the invention with regard to certain specific embodiments thereof, it is to be understood that the description is not meant as a limitation, since further modifications may now suggest themselves to those skilled in the art, and it is intended to cover such modifications as fall within the scope of the appended claims.

We claim:

1. A method for adaptive adjustment of a feed-forward linearized amplifier having an input signal path which divides into two parallel signal paths, at least one signal path having a vector modulation means responsive to control signals for adjusting the amplitude and phase of an input signal propagating in both signal paths, said method comprising the steps of:

generating baseband perturbation patterns for addition to at least one of said signal paths among said input signal path and said two parallel signal paths;

subtracting the outputs of said parallel signal paths one from another to produce a loop output signal;

detecting an amplitude variation due to said perturbation patterns within said loop output signal, and adjusting said vector modulation means via the vector modulation control signals in accordance with said detected amplitude variation to achieve equalization between said parallel signal paths so as to cancel said input signal within said loop output signal.

2. The method of claim 1 wherein the vector modulation control signals are voltage-based.

3. The method of claim 1 wherein the vector modulation control signals are current-based.

4. The method of claim 1 further comprising the step of injecting an additional signal into at least one of said parallel signal paths.

5. The method of claim 1 wherein at least one of said parallel signal paths generates distortion.

6. The method of claim 1 wherein said perturbation patterns are introduced by adding said perturbation patterns to said control signals to produce baseband voltage patterns for adjusting amplitude and phase of said vector modulation means.

7. The method of claim 1 wherein said perturbation patterns are introduced in said input signal.

8. The method of claim 1 wherein perturbation patterns are introduced in said input signal via a voltage controlled amplifier.

9. The method of claim 1 wherein said perturbation patterns are introduced via a vector modulation means in said input signal path.

10. The method of claim 6 wherein the amplitude and phase of said vector modulation means is adjusted by independent control of in-phase and quadrature components of a signal propagating in said one of said parallel signal paths.

11. The method of claim 1 wherein said adjusting step comprises the steps of:

correlating said baseband voltage patterns with said detected amplitude variation over a time period and producing a control voltage; and applying said control voltage to said vector modulation means to adjust said amplitude and phase.

12. The method of claim 1 wherein said adjusting step is performed simultaneously on both in-phase and quadrature components of a signal propagating in said one of said parallel signal paths.

13. The method of claim 6 wherein said detected amplitude variation is used to provide adaptive control of said baseband voltage patterns, by a method including the steps of:

generating two orthogonal perturbation patterns, which are added onto the vector modulation control signals obtained from a pair of loop filters;

correlating said detected amplitude variation and said orthogonal perturbation patterns, and feeding a correlated output to said loop filters producing the vector modulation control signals.

14. The method of claim 8 wherein said detected amplitude variation is used to provide adaptive control of the vector modulation control signals, by a method comprising the steps of:

generating a perturbation pattern which is added to a voltage supplied to said voltage controlled amplifier, correlating said detected amplitude variation and said perturbation pattern, and performing a rectifying operation on a smoothed version of the correlated output, thus producing an error quantity result; and using a minimum searching algorithm to minimize said error quantity result by adjusting the vector modulation control signals.

15. The method of claim 8 wherein said detected amplitude variation is used to provide adaptive control of the vector modulation control signals, by a method comprising the steps of:

generating a perturbation pattern which is added to a voltage supplied to said voltage controlled amplifier;

correlating said detected amplitude variation and said perturbation pattern, and performing a rectifying operation on a smoothed version of the correlated output, thus producing an error quantity result;

generating a pair of orthogonal perturbation patterns which are added onto the vector modulation control signals obtained from a pair of loop filters; and correlating said error quantity result with said pair of orthogonal perturbations and feeding correlated output to said loop filters producing the vector modulation control signals.

16. The method of claim 9 wherein said detected amplitude variation is used to provide adaptive control of the vector modulation control signals associated with said parallel signal paths, by a method comprising the steps of:

generating a pair of orthogonal perturbation patterns which are added to the control signals of the vector modulation means in said input signal path, correlating said detected amplitude variation and said pair of orthogonal perturbation patterns to obtain a pair of correlated outputs, and feeding said pair of correlated outputs to a pair of loop filters, respectively, for generating a pair of loop filter outputs;

performing a pair of rectifying operations on said pair of loop filter outputs, thus producing a pair of error quantities;

summing said pair of error quantities to produce a summed error result; and using a minimum searching algorithm to minimize said summed error result by adjusting the vector modulation control signals associated with said parallel signal paths, wherein all operations performed on pairs of quantities are respective to said first and second quantities in said pairs.

17. The method of claim 9 wherein said detected amplitude variation is used to provide adaptive control of the vector modulation control signals associated with said parallel signal paths, by a method comprising the steps of:

generating a pair of orthogonal perturbation patterns which are added to the control signals of the vector modulation means in said input signal path, correlating said detected amplitude variation and said pair of orthogonal perturbation patterns to obtain a pair of correlated outputs, and feeding said pair of correlated outputs to a pair of loop filters, respectively, for generating a pair of loop filter outputs;

performing a pair of rectifying operations on said pair of loop filter outputs, thus producing a pair of error quantities;

summing said pair of error quantities to produce a summed error result;

generating a second pair of orthogonal perturbation patterns which are added onto the vector modulation control signals in one of said parallel signal paths, obtained from a second pair of loop filters;

correlating said summed error result with said second pair of orthogonal perturbations and feeding correlated output to said second pair of loop filters producing the vector modulation control signals in one of said parallel signal paths.

18. An apparatus for adaptive adjustment of a feed-forward linearized amplifier having an input signal path which divides into two parallel signal paths, at least one signal path having a vector modulation means responsive to control signals for adjusting the amplitude and phase of an input signal propagating in both signal paths, said apparatus comprising:

means for generating baseband perturbation patterns for addition to at least one of said signal paths among said input signal path and said two parallel signal paths;

means for subtracting the outputs of said parallel signal paths one from another to produce a loop output signal;

means for detecting an amplitude variation due to said perturbation patterns within said loop output signal, and means for adjusting said vector modulation means via the vector modulation control signals in accordance with said detected amplitude variation to achieve equalization between said parallel signal paths so as to cancel said input signal within said loop output signal.

19. The apparatus of claim 18 implemented in a digital ASIC chip.

20. The apparatus of claim 18 implemented in a DSP chip.

* * * * *